(12) United States Patent
Enslin et al.

(10) Patent No.: US 11,648,838 B2
(45) Date of Patent: May 16, 2023

(54) ELECTRIFIED VEHICLE AND METHOD FOR GRADUALLY ADJUSTING DISPLAYED STATE OF CHARGE

(71) Applicant: Ford Global Technologies, LLC, Dearborn, MI (US)

(72) Inventors: Heinrich Enslin, Dearborn, MI (US); Lila Ghannam, Northville, MI (US); Charles Everett Badger, II, Westland, MI (US); Xu Wang, Northville, MI (US); Jeffery R. Grimes, Canton, MI (US)

(73) Assignee: Ford Global Technologies, LLC, Dearborn, MI (US)

(*) Notice: Subject to any disclaimer, the term of this patent is extended or adjusted under 35 U.S.C. 154(b) by 0 days.

(21) Appl. No.: 17/520,835

(22) Filed: Nov. 8, 2021

(65) Prior Publication Data

US 2022/0055484 A1 Feb. 24, 2022

Related U.S. Application Data

(63) Continuation of application No. 16/045,798, filed on Jul. 26, 2018, now Pat. No. 11,198,365.

(51) Int. Cl.
*G01R 31/382* (2019.01)
*B60L 3/00* (2019.01)
*G01R 31/36* (2020.01)

(52) U.S. Cl.
CPC ........ *B60L 3/0046* (2013.01); *G01R 31/3648* (2013.01); *G01R 31/382* (2019.01); *B60L 2250/16* (2013.01)

(58) Field of Classification Search
CPC ............... B60L 3/0046; B60L 2250/16; G01R 31/382; G01R 31/3648
USPC .......................................................... 701/29
See application file for complete search history.

(56) References Cited

U.S. PATENT DOCUMENTS

| | | | |
|---|---|---|---|
| 4,876,513 A | 10/1989 | Brilmyer et al. | |
| 5,321,627 A | 6/1994 | Reher | |
| 5,656,919 A | 8/1997 | Proctor et al. | |
| 5,691,078 A * | 11/1997 | Kozaki ................. | G04C 10/04 |
| | | | 324/428 |
| 6,630,813 B2 | 10/2003 | Berels et al. | |
| 6,791,295 B1 | 9/2004 | Berels | |
| 8,125,186 B2 | 2/2012 | Carkner | |
| 8,635,037 B2 | 1/2014 | Quet | |

(Continued)

OTHER PUBLICATIONS

Freddy Trinh. "A Method for Evaluating Battery State of Charge Estimation Accuracy," Master's Thesis EX080/2012, Chalmers University of Technology., Gothenburg, Sweden 2012.

(Continued)

*Primary Examiner* — Tyler J Lee
*Assistant Examiner* — Tiffany P Ohman
(74) *Attorney, Agent, or Firm* — David B. Kelley; Carlson, Gaskey & Olds, P.C.

(57) ABSTRACT

This disclosure relates to an electrified vehicle and a method for gradually adjusting a displayed state of charge. An exemplary electrified vehicle includes a battery, a display configured to display a state of charge of the battery, and a controller configured to adjust the displayed state of charge such that the displayed state of charge gradually converges to an estimated state of charge of the battery.

20 Claims, 6 Drawing Sheets

(56) References Cited

U.S. PATENT DOCUMENTS

| | | |
|---|---|---|
| 9,618,381 B1 | 4/2017 | Dudar |
| 2012/0179395 A1 | 6/2012 | Gilman et al. |
| 2020/0011933 A1* | 1/2020 | Otagiri ................. G01R 31/388 |

OTHER PUBLICATIONS

J. Yin, et al. "Research on State-of-Charge (SOC) Estimation Using Current Integration Based on Temperature Compensation," 2017 IOP Conference Series: Earth and Environmental Science 94 0120165, EEMS 2017, IOP Publishing, 2017.

* cited by examiner

ELECTRIFIED VEHICLE AND METHOD FOR GRADUALLY ADJUSTING DISPLAYED STATE OF CHARGE

RELATED APPLICATIONS

This application is a continuation of prior U.S. application Ser. No. 16/045,798, filed Jul. 26, 2018, the entirety of which is herein incorporated by reference.

TECHNICAL FIELD

This disclosure relates to an electrified vehicle and a method for gradually adjusting a displayed state of charge of a battery. In particular, the displayed state of charge is adjusted such that it gradually converges with an estimated state of charge.

BACKGROUND

The need to reduce automotive fuel consumption and emissions is well known. Therefore, vehicles are being developed that reduce or completely eliminate reliance on internal combustion engines. Electrified vehicles are one type of vehicle currently being developed for this purpose. In general, electrified vehicles differ from conventional motor vehicles because they are selectively driven by one or more battery powered electric machines. Conventional motor vehicles, by contrast, rely exclusively on the internal combustion engine to drive the vehicle.

A high voltage battery pack typically powers the electric machines and other electrical loads of the electrified vehicle. The battery pack includes a plurality of battery cells that must be periodically charged to replenish the energy necessary to power these loads. Electrified vehicles are configured to estimate the state of charge of the battery pack and relay that information to a user so that the user is provided with relevant information about the range of the electrified vehicle.

SUMMARY

An electrified vehicle according to an exemplary aspect of the present disclosure includes, among other things, a battery, a display configured to display a state of charge of the battery, and a controller configured to adjust the displayed state of charge such that the displayed state of charge gradually converges to an estimated state of charge of the battery.

In a further non-limiting embodiment of the foregoing electrified vehicle, the controller is configured to adjust the displayed state of charge based on a predetermined factor of one of a charge rate and a discharge rate of the battery until the displayed state of charge is substantially equal to the estimated state of charge.

In a further non-limiting embodiment of any of the foregoing electrified vehicles, the predetermined factor differs depending upon whether the battery is charging or discharging, and further depending upon whether the displayed state of charge is less than or equal to the estimated state of charge.

In a further non-limiting embodiment of any of the foregoing electrified vehicles, when the battery is discharging and the displayed state of charge exceeds the estimated state of charge, the predetermined factor is twice the discharge rate of the battery.

In a further non-limiting embodiment of any of the foregoing electrified vehicles, when the battery is discharging and the estimated state of charge exceeds the displayed state of charge, the predetermined factor is one half the discharge rate.

In a further non-limiting embodiment of any of the foregoing electrified vehicles, when the battery is charging and the displayed state of charge exceeds the estimated state of charge, the predetermined factor is one half the charge rate of the battery.

In a further non-limiting embodiment of any of the foregoing electrified vehicles, when the battery is charging and the estimated state of charge exceeds the displayed state of charge, the predetermined factor is twice the charge rate.

In a further non-limiting embodiment of any of the foregoing electrified vehicles, the controller is configured to identify a difference between a displayed state of charge and an estimated state of charge of the battery.

In a further non-limiting embodiment of any of the foregoing electrified vehicles, the controller monitors for the difference between drive cycles of the electrified vehicle.

In a further non-limiting embodiment of any of the foregoing electrified vehicles, the controller is configured to calculate a first estimated state of charge during a first drive cycle, the controller causes the display to display the first estimated state of charge, the controller is configured to calculate a second estimated state of charge during a second drive cycle different than the first drive cycle, and if the second estimated state of charge differs from the first estimated state of charge, the controller is configured to adjust the displayed state of charge such that the displayed state of charge gradually converges from the first state of charge to the estimated state of charge.

In a further non-limiting embodiment of any of the foregoing electrified vehicles, the first estimated state of charge is calculated at an end of the first drive cycle and the second estimated state of charge is calculated at a beginning of the second drive cycle.

In a further non-limiting embodiment of any of the foregoing electrified vehicles, the electrified vehicle includes an electric machine, and the battery is capable of outputting electrical power to operate the electric machine.

In a further non-limiting embodiment of any of the foregoing electrified vehicles, the electrified vehicle includes a human-machine interface electrically coupled to the controller, and the human-machine interface includes the display.

A method according to an exemplary aspect of the present disclosure includes, among other things, adjusting a displayed state of charge of a battery of an electrified vehicle such that the displayed state of charge gradually converges to an estimated state of charge of the battery.

In a further non-limiting embodiment of the foregoing method, the adjusting step includes adjusting the displayed state of charge based on a predetermined factor of one of a charge rate and a discharge rate of the battery until the displayed state of charge is substantially equal to the estimated state of charge.

In a further non-limiting embodiment of any of the foregoing methods, the predetermined factor differs depending upon whether the battery is charging or discharging, and further depending upon whether the displayed state of charge is less than or equal to the estimated state of charge.

In a further non-limiting embodiment of any of the foregoing methods, the method includes identifying whether there is a difference between a displayed state of charge and an estimated state of charge of the battery, and the adjusting step is only performed if the difference is identified.

In a further non-limiting embodiment of any of the foregoing methods, the method includes monitoring for the difference between drive cycles of the electrified vehicle.

In a further non-limiting embodiment of any of the foregoing methods, the method includes calculating a first estimated state of charge during a first drive cycle, displaying the first estimated state of charge, calculating a second estimated state of charge during a second drive cycle different than the first drive cycle, if the second estimated state of charge differs from the first estimated state of charge, adjusting the displayed state of charge such that the displayed state of charge gradually converges from the first state of charge to the estimated state of charge.

In a further non-limiting embodiment of any of the foregoing methods, the first estimated state of charge is calculated at an end of the first drive cycle and the second estimated state of charge is calculated at a beginning of the second drive cycle.

DETAILED DESCRIPTION

This disclosure relates to an electrified vehicle and a method for gradually adjusting a displayed state of charge. An exemplary electrified vehicle includes a battery, a display configured to display a state of charge of the battery, and a controller configured to adjust the displayed state of charge such that the displayed state of charge gradually converges to an estimated state of charge of the battery. This disclosure is particularly beneficial when the estimated state of charge of the battery abruptly changes, which may occur when changing drive cycles. In such situations, the user does not perceive a sudden change in state of charge because the displayed state of charge is adjusted gradually. In this way, the user is not confused or alarmed by a sudden change in the state of charge of the battery, which leads to improved consumer confidence. These and other benefits will be appreciated from the below description.

Figure 1:
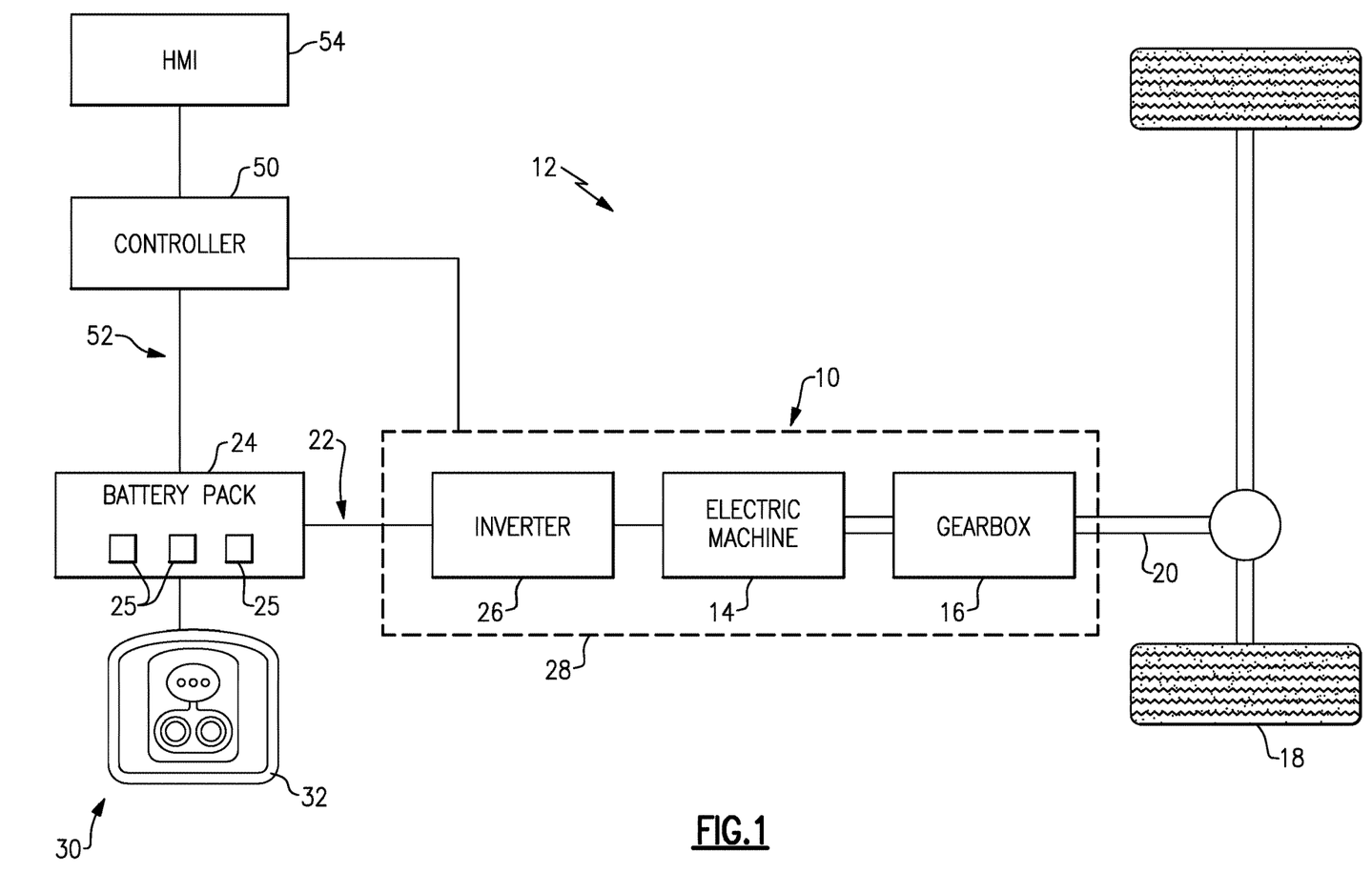
FIG. 1 schematically illustrates a powertrain of an electrified vehicle.

Referring now to the figures, FIG. 1 schematically illustrates a powertrain 10 of an electrified vehicle 12, which is shown as a battery electric vehicle (BEV). Although depicted as a BEV, it should be understood that the concepts described herein are not limited to BEVs and could extend to other electrified vehicles, including but not limited to, plug-in hybrid electric vehicles (PHEVs). Therefore, although not shown in this embodiment, the electrified vehicle 12 could be equipped with an internal combustion engine that can be employed either alone or in combination with other energy sources to propel the electrified vehicle 12. Further, this disclosure extends to any hybrid or electric vehicle including full hybrids, parallel hybrids, series hybrids, mild hybrids, and micro hybrids, among others.

In a non-limiting embodiment, the electrified vehicle 12 is a full electric vehicle propelled solely through electric power, such as by an electric machine 14, without any assistance from an internal combustion engine. The electric machine 14 may operate as an electric motor, an electric generator, or both. The electric machine 14 receives electrical power and provides a rotational output power. The electric machine 14 may be connected to a gearbox 16 for adjusting the output torque and speed of the electric machine 14 by a predetermined gear ratio. The gearbox 16 is connected to a set of drive wheels 18 by an output shaft 20. A high voltage bus 22 electrically connects the electric machine 14 to a battery pack 24 (i.e., a "battery") through an inverter 26. The electric machine 14, the gearbox 16, and the inverter 26 may collectively be referred to as a transmission 28.

The battery pack 24 is an exemplary electrified vehicle battery. The battery pack 24 may be a high voltage traction battery pack that includes a plurality of battery assemblies 25 (i.e., groupings of battery cells commonly known as arrays) capable of outputting electrical power to operate the electric machine 14 and/or other electrical loads of the electrified vehicle 12. Other types of energy storage devices and/or output devices can also be used to electrically power the electrified vehicle 12.

The electrified vehicle 12 may also include a charging system 30 for periodically charging energy storage devices (e.g., battery cells) of the battery pack 24. The charging system 30 may be connected to an external power source, such as a grid power source 48 (FIG. 2), for receiving and distributing power to the energy storage devices. For example, in one non-limiting embodiment, the charging system 30 includes a charging port 32 located on-board the electrified vehicle 12. The charging port 32 is adapted to selectively receive power from the external power source, such as from a power cable connected to the external power source, and then distribute the power to the battery pack 24 for charging the energy storage devices.

The charging system 30 may also be equipped with power electronics used to convert AC power received from the external power supply to DC power for charging the energy storage devices of the battery pack 24. The charging system 30 may also accommodate one or more conventional voltage sources from the external power supply (e.g., 110 volt, 220 volt, etc.).

The powertrain 10 shown in FIG. 1 is highly schematic and is not intended to limit this disclosure. Various additional components could alternatively or additionally be employed by the powertrain 10 within the scope of this disclosure.

Figure 2:
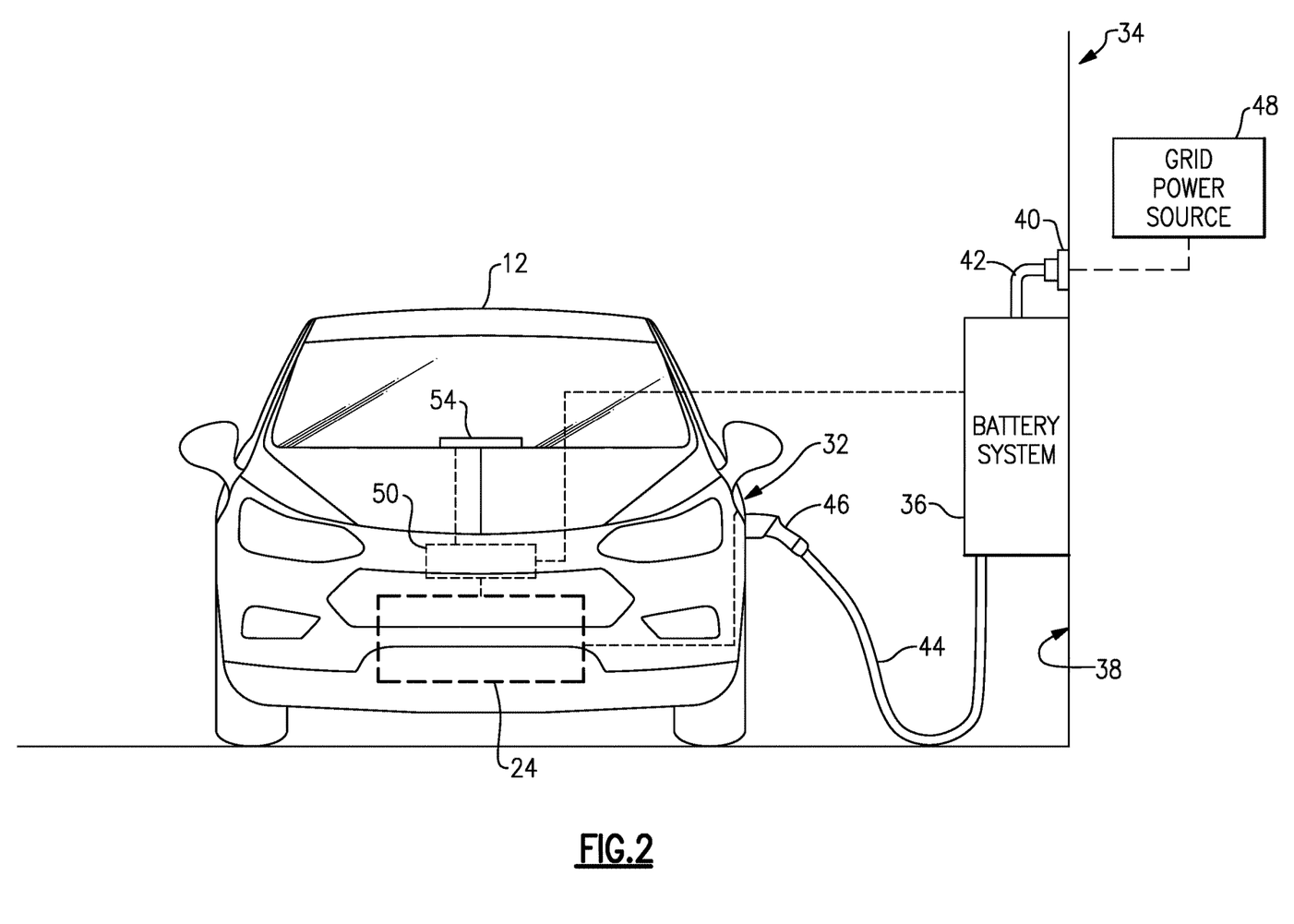
FIG. 2 shows an electrified vehicle incorporating the powertrain of FIG. 1 and located in a charging position relative to a battery system.

FIG. 2 schematically depicts the electrified vehicle 12 of FIG. 1 parked in a charging position near a structure 34. The structure 34 could be a residential building, a commercial building, a parking garage, or any other structure. In a non-limiting embodiment, the structure 34 is a garage located at the home of the owner/operator of the electrified vehicle 12. It should be understood that the various components of FIG. 2 are shown schematically to better illustrate the features of this disclosure.

A battery system 36 for charging the battery pack 24 of the electrified vehicle 12 may be mounted to a surface 38, such as a wall or a floor, of the structure 34. The battery system 36 may be electrically coupled to a power outlet 40 by a first power cable 42. A second power cable 44 extends between the battery system 36 and the charging port 32 of the electrified vehicle 12. A vehicle coupler 46, such as a plug, of the second power cable 44 is coupled to the charging port 32 to allow power to be transferred from the battery system 36 to the electrified vehicle 12, and more specifically to the battery pack 24 of the electrified vehicle 12.

A grid power source 48 can supply power to the battery system 36 once the first power cable 42 is connected to the power outlet 40. In a non-limiting embodiment, the grid power source 48 is an AC power source that inputs power to the battery system 36 at either 110 volts or 220 volts. The power supplied to the battery system 36 may be stored therein and then selectively used to charge the battery pack 24 of the electrified vehicle 12. Thus, the battery system 36 can be used to charge the battery pack 24 of the electrified vehicle 12 even when power is not available from the grid power source 48. While FIG. 2 illustrates one example battery system arrangement, this disclosure is not limited to the particular arrangement of FIG. 2.

With reference back to FIG. 1, the electrified vehicle 12 includes a controller 50 for monitoring and/or controlling various aspects of the powertrain 10 associated with the electrified vehicle 12. The controller 50, for example, may communicate with the battery pack 24, the charging system 30, and the charging port 32. The controller 50 may also communicate with various other vehicle components and monitor other vehicle conditions. The controller 50 includes electronics, software, or both, to perform the necessary control functions for operating the electrified vehicle 12.

In one non-limiting embodiment, the controller 50 is a combination vehicle system controller and powertrain control module (VSC/PCM). Although it is shown as a single device, the controller 50 may include multiple controllers in the form of multiple hardware devices, or multiple software controllers with one or more hardware devices. A controller area network 52 (CAN) allows the controller 50 to communicate with the various components of the electrified vehicle 12 as well as the battery system 36.

Figure 3:
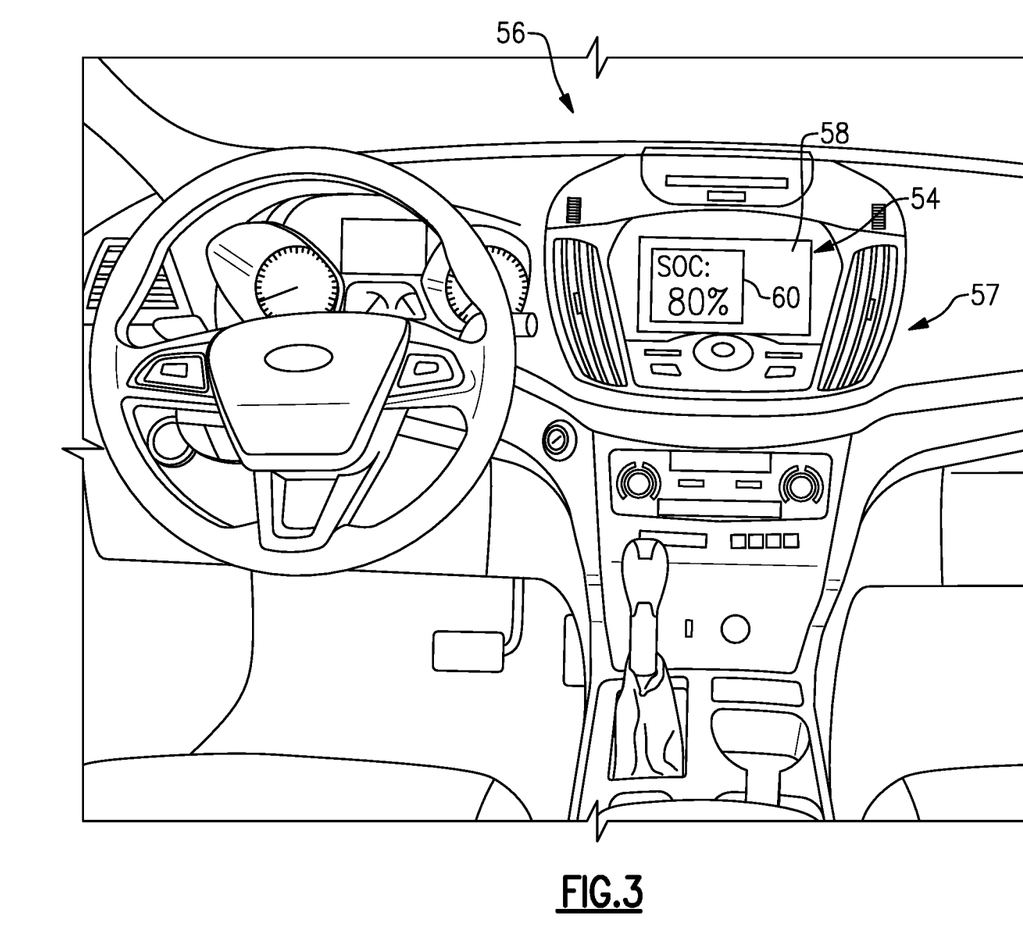
FIG. 3 illustrates an example vehicle cabin, and in particular illustrates an example human-machine interface.

The electrified vehicle 12 also includes a display, which in this example is part of a human-machine interface 54 (i.e., HMI 54). As generally shown in FIGS. 2 and 3, a human-machine interface 54 is provided in a vehicle cabin and is accessible by a user from within the electrified vehicle 12. The human-machine interface 54 is provided by an interactive display, such as a graphical user interface (GUI), in this example. In one particular example, the human-machine interface 54 includes a touchscreen 58, which is configured to display information to the user and allow the user to provide inputs. This disclosure extends to other types of displays, and is not limited to human-machine interfaces.

The controller 50 is in communication with the human-machine interface 54. One example human-machine interface 54 is provided, at least in part, by the SYNC® System offered commercially by Ford Motor Company. Among other functions, the controller 50 is configured to display a state of charge of the battery pack 24 via the human-machine interface 54.

FIG. 3 illustrates an example vehicle cabin 56 and, in particular, illustrates an in-vehicle infotainment (IVI) system 57. The in-vehicle infotainment system 57 includes the human-machine interface 54. The human-machine interface 54 includes a touchscreen 58 configured to display information to a user and allow the user to provide inputs by touching the touchscreen 58. While a touchscreen 58 is shown and described herein, this disclosure is not limited to touchscreens, and extends to other types of displays and human-machine interfaces.

Among other functions, the controller 50 is configured to display a state of charge of the battery pack 24 on the human-machine interface 54. In FIG. 3, for example, a state of charge is displayed in block 60. The example displayed state of charge is 80%. The state of charge may be displayed in other locations within the vehicle, such as the dashboard, however.

The controller 50 is configured to estimate the state of charge of the battery pack 24 periodically and continually during operation of the electrified vehicle 12. The controller 50 may estimate the state of charge of the battery pack 24 using one or more algorithms that consider a number of factors, such as charge rate, charging voltage, discharge rate, discharge voltage, battery capacity, drive cycle, battery material, ambient temperature, ambient pressure, humidity, etc. In other words, the controller 50 is programmed to repeatedly perform one or more types of calculations that continually estimate the state of charge of the battery pack 24 while the electrified vehicle 12 is in use.

For all intents and purposes, the estimated state of charge of the battery pack 24 is treated as the actual state of charge of the battery pack 24. That said, the algorithms used by the controller 50 are more accurate and representative of the actual state of charge of the battery pack 24 in certain conditions. For example, the estimated state of charge determined by the controller 50 during a driving condition (i.e., when the electrified vehicle 12 is driving) may be slightly less accurate than an estimated state of charge determined during a no load condition, such as when the vehicle is parked or during an initial vehicle startup.

During most operating conditions, the controller 50 estimates the state of charge of the battery pack 24, and commands the human-machine interface 54 to display the estimated state of charge. In other words, the displayed state of charge (which is the state of charge displayed to the user via block 60 of the human-machine interface 54, for example) is the same as the estimated state of charge. However, if the estimated state of charge abruptly changes, which may happen when changing drive cycles or under other conditions, this disclosure does not relay abrupt changes to the user, and instead gradually adjusts the displayed state of charge until it converges with the estimated state of charge. This aspect of the disclosure will now be described in detail with reference to the flow charts of FIGS. 4 and 5, and the graphical representation of FIG. 6.

Figure 4:
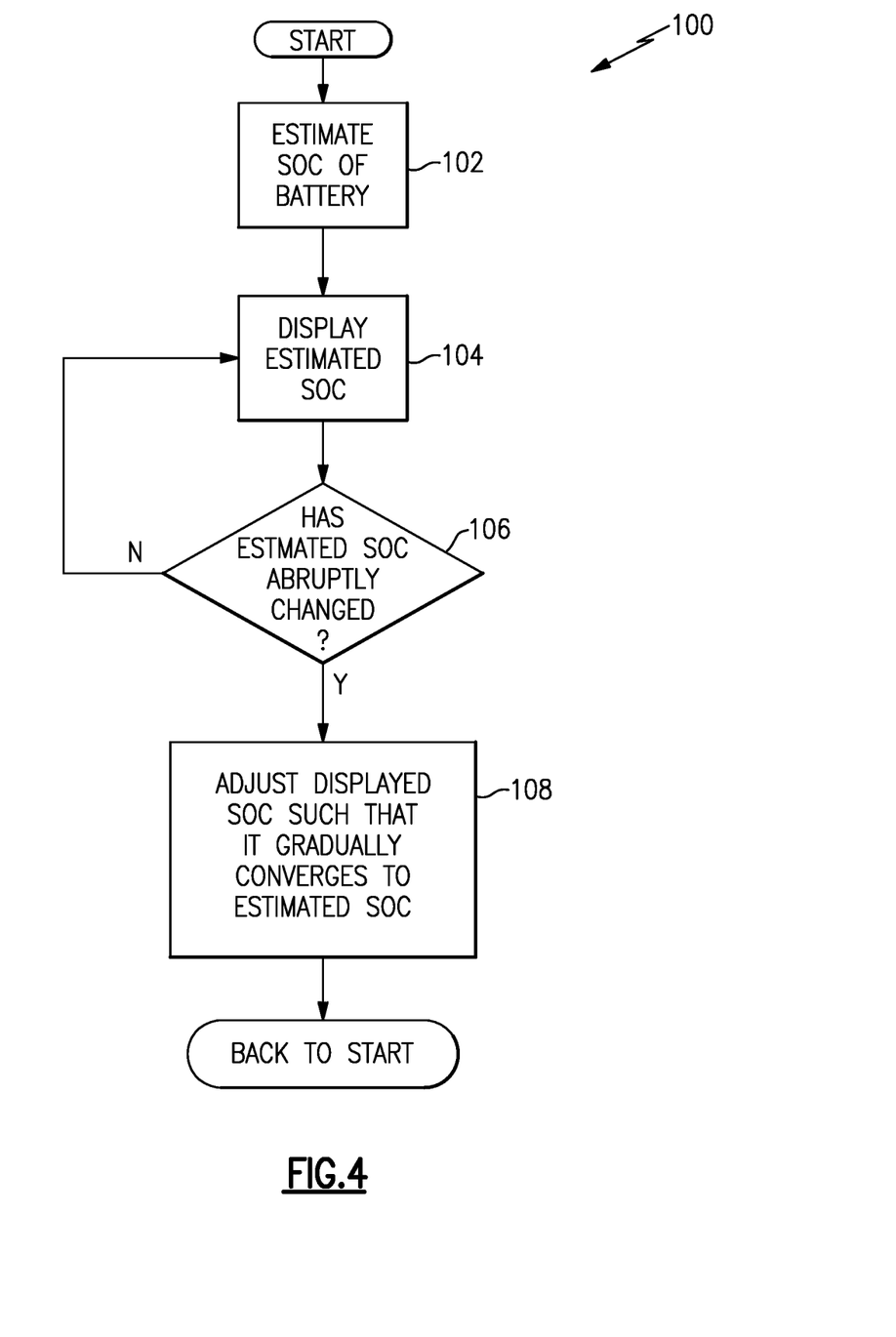
FIG. 4 is a flow chart representative of an example method according to this disclosure.

FIG. 4 is a flow chart representative of an example method 100 according to this disclosure. In the method 100, the controller 50 estimates the state of charge of the battery pack 24, at 102, using one or more algorithms, as discussed above. In turn, the controller 50 commands the human-machine interface 54 to display the estimated state of charge such that it is visible to the user, at 104.

At 106, the controller 50 continues periodically estimating the state of charge of the battery pack 24, using the same algorithms as in step 102, and monitors for abrupt changes in the estimated state of charge. In this disclosure, abrupt changes are changes outside a predetermined range that occur within a predetermined time period. For example, the predetermined range may be 3% and the predetermined time period may be 10 seconds. Thus, if conditions are such that the estimated state of charge changes by 8% in 2 seconds, then the controller 50 will consider this to be an abrupt change. This disclosure is not limited to these particular threshold values and extends to other predetermined ranges and time periods.

Alternatively or in addition, abrupt changes are changes that occur outside a predetermined range between drive cycles. For instance, if a user drives the electrified vehicle 12 into their garage at night and parks it with an estimated and displayed state of charge of 80%, the user will expect to the controller 50 to store that state of charge value and display the same or substantially the same state of charge when starting the electrified vehicle 12 the following morning, for example. However, as discussed generally above, the estimated state of charge of the controller 50 may be more accurate at startup than when the electrified vehicle 12 is being driven. Thus, at startup, the controller 50 may estimate that the state of charge of the battery pack 24 is 70% the following morning. Such a change between drive cycles is also be considered an abrupt change despite the change occurring over a longer period of time. It should be understood that these are exemplary abrupt changes only. This disclosure extends to other abrupt changes. In fact, this disclosure may extend to any change resulting in any difference between an estimated state of charge and a displayed state of charge.

At 108, when the estimated state of charge abruptly changes, the controller 50 causes the human-machine interface 54, for example, to adjust the displayed state of charge (i.e., the value in block 60) such that the displayed state of charge gradually converges to the estimated state of charge of the battery pack 24. When the displayed state of charge reaches the estimated state of charge, the method reverts back to the beginning. As mentioned above, gradually adjusting the displayed state of charge avoids needlessly causing the user to become alarmed or confused over abrupt changes in the state of charge, which leads to improved consumer confidence.

Figure 5:
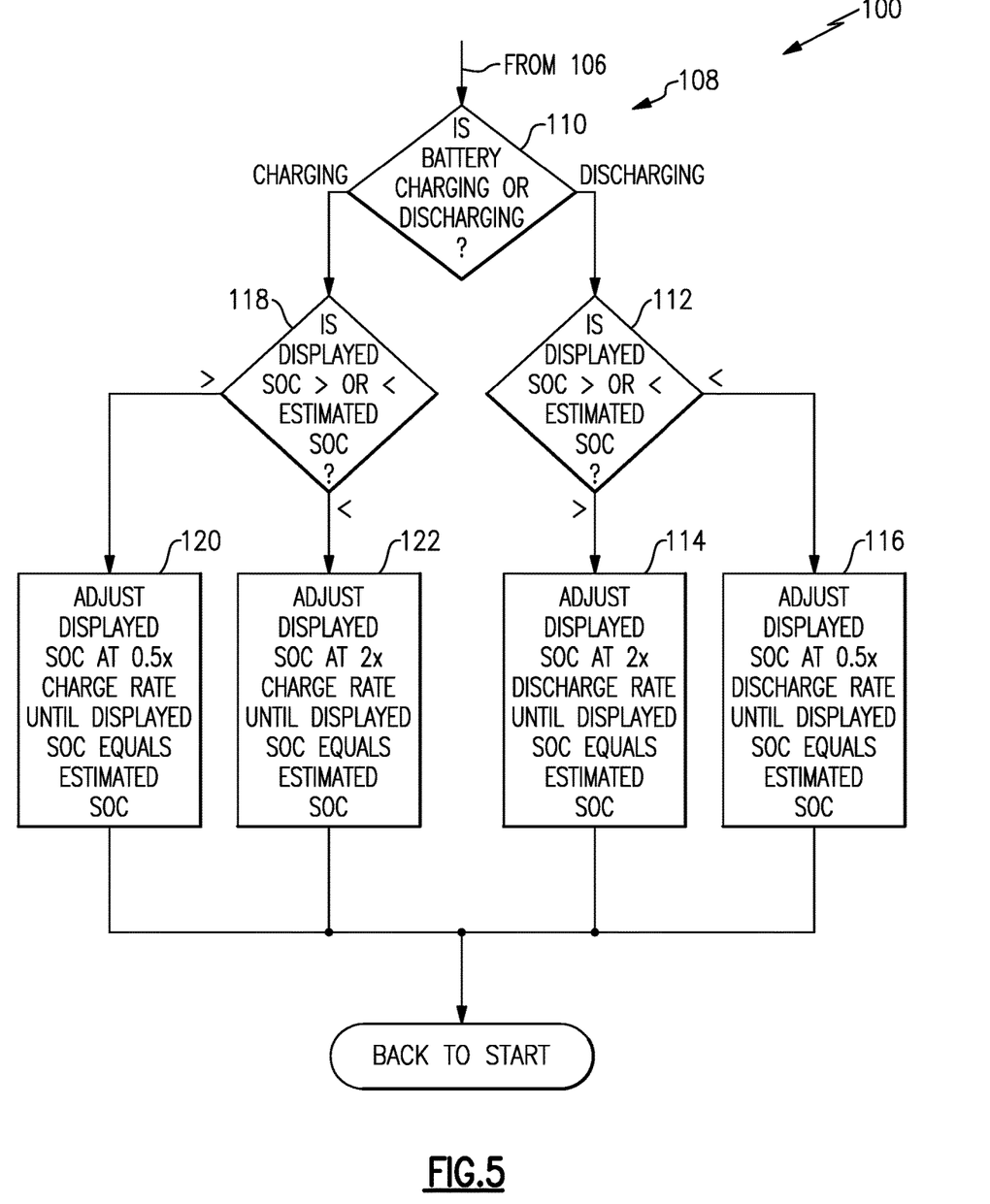
FIG. 5 is a flow chart representative of an aspect of the example method of FIG. 4.

FIG. 5 is a flow chart representative of the detail of step 108 of the method 100. In general, in step 108, the controller 50 adjusts the displayed state of charge based on a predetermined factor of one of a charge rate and a discharge rate of the battery pack 24 until the displayed state of charge is substantially equal to the estimated state of charge. In this disclosure, the predetermined factor differs depending upon whether the battery pack 24 is charging or discharging, and further depending upon whether the displayed state of charge is less than or equal to the estimated state of charge.

In one particular example, the controller 50 considers whether the battery pack 24 is charging or discharging, at 110. When the battery pack 24 is discharging, the controller 50 considers whether the displayed state of charge exceeds the estimated state of charge, at 112. If so, the controller 50 adjusts the displayed state of charge at a rate twice (i.e., "2×") that of the discharge rate of the battery pack 24, at 114, until the displayed state of charge is substantially equal to the estimated state of charge. In this case, the predetermined factor is twice the discharge rate of the battery pack 24. This disclosure is not limited to any particular predetermined factor, however. For example, the displayed state of charge could be adjusted using any predetermined factor greater than one, such as three.

If the displayed state of charge is less than the estimated state of charge, as determined at 112, the controller 50 uses a predetermined factor of one half (i.e., "0.5×"), and adjusts the displayed state of charge, at 116, at a rate of one half the discharge rate until the displayed state of charge is substantially equal to the estimated state of charge. Again, this disclosure is not limited to a predetermined factor of one half. The predetermined factor could be any number less than one, such as one third, for example.

With continued reference to the example of FIG. 5, if the controller 50 determines that the battery pack 24 is charging at 110, the controller 50 considers whether the displayed state of charge exceeds the estimated state of charge, at 118. If so, the controller 50 uses a predetermined factor of one half the charge rate, and, at 120, adjusts the displayed state of charge at a rate of one half the charge rate until the displayed state of charge is substantially equal to the estimated state of charge. Likewise, if the displayed state of charge is less than the estimated state of charge, as determined at 118, the controller 50 uses a predetermined factor of twice, and, at 122, adjusts the displayed state of charge at a rate of twice the charge rate until the displayed state of charge substantially equals the estimated state of charge.

As will be appreciated from the above, the method 100 gradually adjusts the displayed state of charge such that the user does not perceive abrupt changes in estimated state of charge. In this way, this disclosure blends the displayed state of charge into the estimated state of charge. It will also be appreciated that this disclosure is not limited to the particular details of the method 100. Again, the predetermined factors of twice and one half are exemplary only. Further, if the predetermined factors do not cause the displayed state of charge to converge to the estimated state of charge within a predetermined time, the predetermined factors may be changed in real time.

Figure 6:
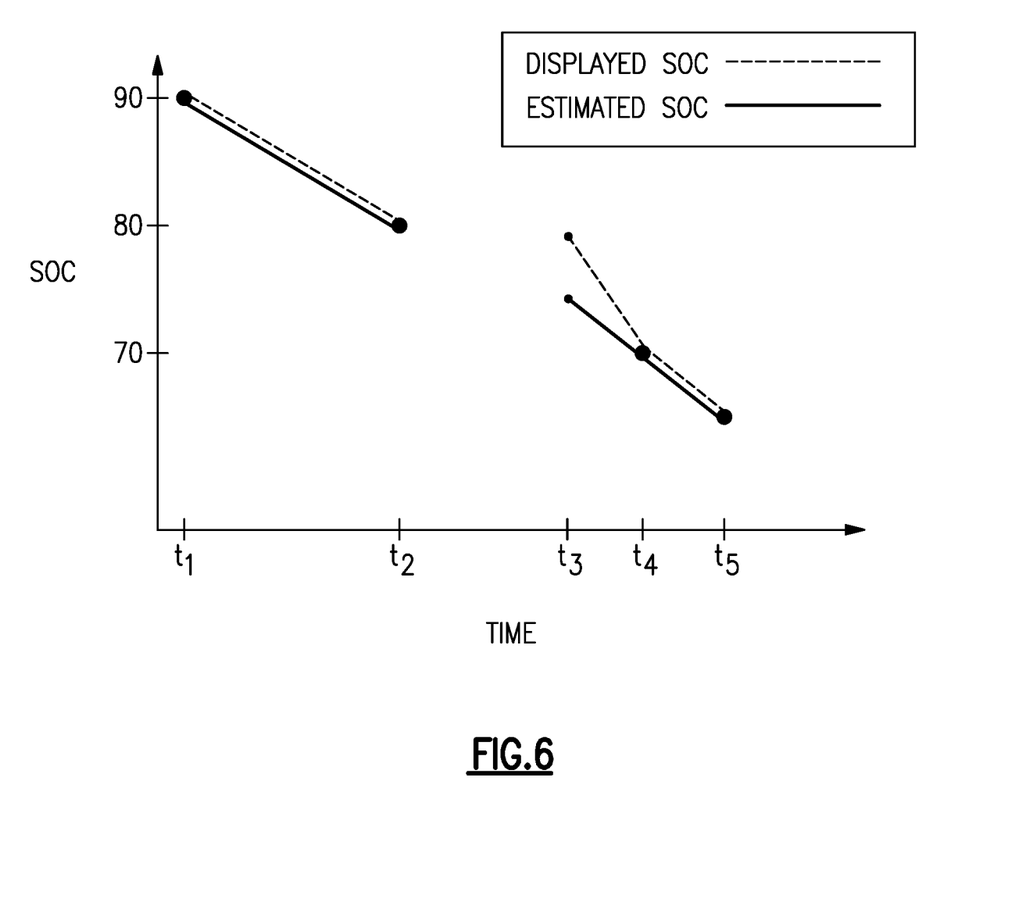
FIG. 6 is a graphical representation of an example scenario in which the method may be used.

FIG. 6 is a graphical representation of an example scenario in which the method 100 may be beneficial. It should be understood that the method 100 may be employed in other scenarios. In FIG. 6, the vertical axis is state of charge, and the horizontal axis is time. The displayed state of charge is represented by a dashed line, while the estimated state of charge is represented by a solid line.

At time $t_1$ the controller 50 estimates that electrified vehicle 12 has a state of charge of 90%. The controller 50 also displays a state of charge of 90% to the user via the human-machine interface 54, for example. Between times $t_1$ and $t_2$, the electrified vehicle 12 is being driven, such as from a user's office to their home, and thus the controller 50 estimates that the state of charge of the battery pack 24 continually decreases. In this example, the estimated state of charge decreased from 90% to 80% between times $t_1$ and $t_2$. Further, the displayed state of charge was equal to the estimated state of charge between these times, because the controller 50 did not identify any abrupt changes in estimated state of charge. In other words, with reference to the method 100, the controller 50 determined that the answer to 106 was "no" between times $t_1$ and $t_2$.

In this example, the user has parked the electrified vehicle 12 at their home at time $t_2$. The human-machine interface 54 displays a state of charge of 80% at this time. Between times $t_2$ and $t_3$, the electrified vehicle 12 is parked and turned off. Additionally, between times $t_2$ and $t_3$, the electrified vehicle 12 may be on plug, as in FIG. 2, undergoing a process in which the state of charge of the electrified vehicle 12 is intended to be held substantially constant, in this case at 80%.

At time $t_3$, which may be later in the day or the following morning, the user unplugs the vehicle coupler 46, re-enters the electrified vehicle 12, starts the electrified vehicle 12, and begins driving. Thus, the electrified vehicle 12 is in a different drive cycle at times $t_2$ and $t_3$. Specifically, time $t_2$ is the end of a first drive cycle, and time $t_3$ is the beginning of a second drive cycle.

At time $t_3$, the method 100 begins at step 106, and the controller 50 estimates the state of charge of the battery pack 24. In this example, the controller 50 estimates that the state of charge of the battery pack 24 is 75%, which is less than the estimated state of charge of 80% at time $t_2$. To this end, the controller 50 is configured to store the previous displayed states of charge in memory and to compare the real-time estimates to those stored values.

The difference in estimated states of charge between times $t_2$ and $t_3$ is considered an abrupt change in the method, at 106. Thus, the controller 50 does not display the abruptly-changed state of charge to the user. Rather, the method proceeds to step 108, and displays the stored state of charge from time $t_2$, which in this example was 80%, and gradually adjusts the displayed state of charge such that it converges with the estimated state of charge.

In this example, at time $t_3$, the vehicle 12 is driving and thus the battery pack 24 is being discharged. Thus, the controller 50 answers "discharging" at 110, and moves to the right-hand side of the flow chart in FIG. 5. Further, because the displayed state of charge (80%) is greater than the estimated state of charge (75%), the controller 50 answers "greater than" at 112, and proceeds to, at 114, adjust the displayed state of charge at a rate twice that of the discharge rate of the battery until the displayed state of charge is equal to the estimated state of charge, at time $t_4$. In other words, the slope of the displayed state of charge is twice that of the estimated state of charge between times $t_3$ and $t_4$.

At time $t_4$, the estimated state of charge and the displayed state of charge are substantially equal to one another at about 70%. Between times $t_4$ and $t_5$, the battery pack 24 is continually discharged, but there are no abrupt changes in the estimated state of charge, and thus the displayed state of charge is equal to the estimated state of charge. Again, the example of FIG. 6 is provided herein for purposes of explanation only, and this disclosure extends to other examples, including other drive cycles and other driving conditions/scenarios.

It should be understood that terms such as "about," "substantially," and "generally" are not intended to be boundaryless terms, and should be interpreted consistent with the way one skilled in the art would interpret those terms.

Although the different examples have the specific components shown in the illustrations, embodiments of this disclosure are not limited to those particular combinations. It is possible to use some of the components or features from one of the examples in combination with features or components from another one of the examples. In addition, the various figures accompanying this disclosure are not necessarily to scale, and some features may be exaggerated or minimized to show certain details of a particular component or arrangement.

One of ordinary skill in this art would understand that the above-described embodiments are exemplary and non-limiting. That is, modifications of this disclosure would come within the scope of the claims. Accordingly, the following claims should be studied to determine their true scope and content.

The invention claimed is:

1. An electrified vehicle, comprising:
   a battery;
   a display configured to display a state of charge of the battery; and
   a controller configured to continuously or in regular intervals: calculate an estimated state of charge of the battery, calculate either a discharge rate of the battery when the battery is discharging or a charge rate of the battery when the battery is charging, and selectively adjust the displayed state of charge,
   wherein, when the battery is discharging and the estimated state of charge exceeds the displayed state of charge, the controller is configured to adjust the displayed state of charge at a rate of less than one times the discharge rate of the battery until the displayed state of charge is equal to the estimated state of charge.

2. The electrified vehicle as recited in claim 1, wherein, when the battery is discharging and the estimated state of charge exceeds the displayed state of charge, the controller is configured to adjust the displayed state of charge at a rate of one half the discharge rate of the battery until the displayed state of charge is equal to the estimated state of charge.

3. The electrified vehicle as recited in claim 1, wherein the controller is configured to identify a difference between the displayed state of charge and the estimated state of charge.

4. The electrified vehicle as recited in claim 3, wherein the controller monitors for the difference between drive cycles of the electrified vehicle.

5. The electrified vehicle as recited in claim 4, wherein:
   the controller is configured to calculate a first estimated state of charge during a first drive cycle;
   the controller causes the display to display the first estimated state of charge;
   the controller is configured to calculate a second estimated state of charge during a second drive cycle different than the first drive cycle; and
   when the second estimated state of charge differs from the first estimated state of charge, the controller is configured to adjust the displayed state of charge such that the displayed state of charge converges from the first estimated state of charge to the second estimated state of charge.

6. The electrified vehicle as recited in claim 5, wherein the first estimated state of charge is calculated at an end of the first drive cycle and the second estimated state of charge is calculated at a beginning of the second drive cycle.

7. The electrified vehicle as recited in claim 1, further comprising an electric machine, the battery capable of outputting electrical power to operate the electric machine.

8. The electrified vehicle as recited in claim 1, further comprising a human-machine interface electrically coupled to the controller, the human-machine interface including the display.

9. The electrified vehicle as recited in claim 1, wherein, when the battery is discharging and the estimated state of charge exceeds the displayed state of charge, the controller is configured to adjust the displayed state of charge at a rate equal to greater than zero and less than one times the discharge rate of the battery until the displayed state of charge is equal to the estimated state of charge.

10. The electrified vehicle as recited in claim 1, wherein, when the battery is discharging and the estimated state of charge exceeds the displayed state of charge, the controller is configured to adjust the displayed state of charge at a rate of one third the discharge rate of the battery until the displayed state of charge is equal to the estimated state of charge.

11. The electrified vehicle as recited in claim 1, wherein, when the battery is discharging and the estimated state of charge exceeds the displayed state of charge, the controller is configured to adjust the displayed state of charge at a slower rate than the discharge rate of the battery until the displayed state of charge is equal to the estimated state of charge.

12. A method, comprising:
   calculating continuously or in regular intervals both an estimated state of charge of a battery of an electrified vehicle, and either a charge rate when the battery is charging or a discharge rate when the battery is discharging; and adjusting a displayed state of charge of the battery, wherein, when the battery is discharging and the estimated state of charge exceeds the displayed state of charge, the adjusting step includes adjusting the displayed state of charge at a rate of less than one times the discharge rate of the battery until the displayed state of charge is equal to the estimated state of charge.

13. The method as recited in claim 12, further comprising:
identifying whether there is a difference between the displayed state of charge and the estimated state of charge of the battery, and wherein the adjusting step is only performed when the difference is identified.

14. The method as recited in claim 13, further comprising:
monitoring for the difference between drive cycles of the electrified vehicle.

15. The method as recited in claim 12, further comprising:
calculating a first estimated state of charge during a first drive cycle;
displaying the first estimated state of charge;
calculating a second estimated state of charge during a second drive cycle different than the first drive cycle; and
when the second estimated state of charge differs from the first estimated state of charge, the adjusting step includes adjusting the displayed state of charge such that the displayed state of charge converges from the first estimated state of charge to the second estimated state of charge.

16. The method as recited in claim 15, wherein the first estimated state of charge is calculated at an end of the first drive cycle and the second estimated state of charge is calculated at a beginning of the second drive cycle.

17. The method as recited in claim 12, wherein:
the calculating step includes assigning a timestamp to the estimated state of charge;
both the estimated state of charge and the displayed state of charge are both percentages between 0% and 100%; and
the adjusting step is only performed when the estimated state of charge deviates from the displayed state of charge by an amount greater than a predetermined maximum deviation percentage difference between the displayed state of charge and the estimated state of charge within a predetermined time period from an instant in time associated with the timestamp.

18. The method as recited in claim 17, wherein the predetermined maximum deviation percentage difference between the displayed state of charge and the estimated state of charge is 3% and the predetermined time period is 10 seconds.

19. The method as recited in claim 12, wherein, when the battery is discharging and the estimated state of charge exceeds the displayed state of charge, the adjusting step includes adjusting the displayed state of charge at a slower rate than the discharge rate of the battery until the displayed state of charge is equal to the estimated state of charge.

20. A method, comprising:
calculating continuously or in regular intervals an estimated state of charge of a battery of an electrified vehicle, and either a charge rate when a battery is charging or a discharge rate when the battery is discharging; and
adjusting a displayed state of charge of the battery, wherein, when the battery is charging and the displayed state of charge exceeds the estimated state of charge, the adjusting step includes adjusting the displayed state of charge at a rate of less than one times the charge rate of the battery until the displayed state of charge is equal to the estimated state of charge.

* * * * *